(12) United States Patent
Blees et al.

(10) Patent No.: US 10,060,596 B2
(45) Date of Patent: Aug. 28, 2018

(54) METHOD OF MANUFACTURING A CERAMIC LIGHT TRANSMITTING BARRIER CELL, AND A BARRIER CELL PRODUCED BY THAT METHOD

(71) Applicant: KONINKLIJKE PHILIPS N.V., Eindhoven (NL)

(72) Inventors: Martin Hillebrand Blees, S-Hertogenbosch (NL); Durandus Kornelius Dijken, Eindhoven (NL); Petrus Antonius Augustinus Huberts, Mierlo (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/039,288

(22) PCT Filed: Dec. 2, 2014

(86) PCT No.: PCT/EP2014/076214
§ 371 (c)(1),
(2) Date: May 25, 2016

(87) PCT Pub. No.: WO2015/082452
PCT Pub. Date: Jun. 11, 2015

(65) Prior Publication Data
US 2017/0051892 A1 Feb. 23, 2017

(30) Foreign Application Priority Data
Dec. 3, 2013 (EP) .................................... 13195528

(51) Int. Cl.
*F21V 3/04* (2006.01)
*F21V 31/00* (2006.01)
(Continued)

(52) U.S. Cl.
CPC .............. *F21V 3/0463* (2013.01); *B28B 1/24* (2013.01); *C09K 11/00* (2013.01); *F21V 31/005* (2013.01);
(Continued)

(58) Field of Classification Search
None
See application file for complete search history.

(56) References Cited

U.S. PATENT DOCUMENTS 4,824,625 A * 4/1989 Claar .................... C04B 35/652
264/126
9,731,473 B2 * 8/2017 Schwartz ................ B32B 3/263
(Continued)

FOREIGN PATENT DOCUMENTS

EP 2568337 A2 3/2013
WO 2008078228 A1 7/2008
(Continued)

OTHER PUBLICATIONS

EPO as ISA, International Search Report and Written Opinion dated Feb. 23, 2015 from International Application No. PCT/EP2014/076214, filed Dec. 2, 2014, 13 pages.
(Continued)

*Primary Examiner* — Ashok Patel

(57) ABSTRACT

A method 100 of manufacturing a ceramic light transmitting barrier cell for enclosing a luminescent material and such a ceramic light transmitting barrier cell are provided. A part of a pre-formed barrier cell is formed 102 by providing a material mix comprising a binder and inorganic particles in a first mold. On the part is provided 104 a sacrificial layer for defining a cavity. A remainder part of the pre-formed barrier cell is formed 106 by providing the material mix in a second mold which already comprises the part with the sacrificial layer. The sacrificial layer is at least partially
(Continued)

removed 112 to obtain the cavity. Optionally, the pre-formed barrier cell is heated 114, 116 (and/or sintered) to obtain the ceramic light transmitting barrier cell. The method 100 of manufacturing is suitable for producing at large scale relatively cheap and accurately formed ceramic light transmitting barrier cells.

21 Claims, 5 Drawing Sheets

(51) Int. Cl.
*C09K 11/00* (2006.01)
*B28B 1/24* (2006.01)
*C09K 11/08* (2006.01)
*H01L 33/50* (2010.01)
*F21K 9/64* (2016.01)
*F21Y 115/10* (2016.01)

(52) U.S. Cl.
CPC ............... *C09K 11/08* (2013.01); *F21K 9/64* (2016.08); *F21Y 2115/10* (2016.08); *H01L 33/505* (2013.01)

(56) References Cited

U.S. PATENT DOCUMENTS

| | | | |
|---|---|---|---|
| 2002/0150760 A1 | 10/2002 | Klinedinst | |
| 2010/0026183 A1* | 2/2010 | Raas | H01J 9/395 313/634 |
| 2012/0007130 A1* | 1/2012 | Hoelen | H01L 33/504 257/98 |
| 2013/0056705 A1* | 3/2013 | Kim | G03F 7/0002 257/13 |
| 2013/0223922 A1 | 8/2013 | Koval et al. | |

FOREIGN PATENT DOCUMENTS

WO 2010106504 A1 9/2010
WO 2011087098 A1 7/2011

OTHER PUBLICATIONS

Office Action dated Nov. 17, 2017, Taiwan application No. 103141661, 7 pages.
Mutsuddy, et al. "Ceramic Injection Molding", Chapter 1—"Overview of injection molding" and Chapter 5—"The molding process and mold design", Chapman & Hall, 1995, pp. 1-26, pp. 167-244.

* cited by examiner

METHOD OF MANUFACTURING A CERAMIC LIGHT TRANSMITTING BARRIER CELL, AND A BARRIER CELL PRODUCED BY THAT METHOD

CROSS-REFERENCE TO RELATED APPLICATIONS

The present application is a § 371 application of International Application No. PCT/EP2014/076214 filed on Dec. 2, 2014 and entitled "A Method of Manufacturing a Ceramic Light Transmitting Barrier Cell, and a Barrier Cell Produced by that Method," which claims priority to European Patent Application No. 13195528.8, filed Dec. 3, 2013. Both PCT/EP2014/076214 and 13195528.8 are incorporated herein.

FIELD OF THE INVENTION

The invention relates to manufacturing method for manufacturing a light transmitting barrier cell. The light transmitting barrier cell is for enclosing luminescent material in a cavity of the light transmitting barrier cell such that no liquid and no gasses can penetrate through the barrier cell and reach the luminescent material.

The invention further relates to barrier cells of a ceramic light transmitting material.

BACKGROUND OF THE INVENTION

Several luminescent materials, in particular Quantum Dots, need to be protected against moisture and oxygen because, when they are in contact with oxygen or water, they may react with it and become dysfunctional. Therefore, they need to be provided in air and liquid tight packages. Conventional ways to provide such air tight packages are manufacturing, for example, two halves of a transparent or translucent cell-like structure, providing the Quantum Dots in one of the halves and air-tightly gluing the second half to the first half. Often, the layer of Quantum Dots has to be thin, and, as such, a cavity of the cell-like structure is thin as well. When an excessive amount of glue is used, it might be that, within the cavity, a too large portion of the Quantum Dots is pushed away by the excessive amount of glue resulting in a Quantum Dot cell that has to be rejected. When organic glues are used, it is difficult to create a gas-tight package, because organic glues are often permeable for gasses. Instead of using organic glues, the two halves may be coupled to each other by means of glass frit bonding.

Luminescent materials absorb light according to an absorption distribution and they convert the absorbed energy towards light of another color that is emitted according to an emission distribution. In general the light of another color has a longer wavelength than the wavelength of the absorbed light. A further characteristic of luminescent materials, and more in particular Quantum Dots, is that they convert light less efficiently when they become relatively warm. It might even be that the Quantum Dots are degraded or even destroyed when the temperature of the Quantum Dots becomes too high. During use, luminescent materials becomes warm because of the Stokes Shifts, which means that not all absorbed light is converted towards light of another wavelength, but a portion of the absorbed light energy is converted towards heat. Therefore, when a solution is designed to air-tightly seal luminescent material, it should be capable of conducting heat away from the luminescent material.

Published patent application US2013/0223922 discloses a manufacturing of a cell-like structure that is gas-tight and in which, for example, Quantum Dots might be provided. The cell-like structure is manufactured by providing a glass-coated gasket or providing on the glass substrate a structure of low-melting temperature glass on a first glass substrate, subsequently providing, for example, the quantum dots on the first glass substrate in between the gasket or structure, thereafter providing a second glass substrate on top of this and finally tighten the cell-like structure by heating the glass-coated gasket or structure such that they fasten to the substrates. Although the glass of the glass-coated gasket or structure melts at a relatively low temperature, in a range from 200 to 500° C., the temperature may still be too high for Quantum Dots such that a substantial portion of the Quantum Dots becomes defective. Furthermore, the manufacturing process is relatively expensive, because it requires manufacturing several parts, which must be kept in stock, and which must be assembled. Therefore, the cell-like structures manufactured according to the process of the cited patent application are relatively expensive.

SUMMARY OF THE INVENTION

It is an object of the invention to provide a manufacturing method for more efficiently manufacturing a cell-like structure which is suitable for air-tightly sealing luminescent material.

A first aspect of the invention provides a manufacturing method of manufacturing a ceramic light transmitting barrier cell. A second aspect of the invention provides a barrier cell of a light transmitting ceramic material. Advantageous embodiments are defined in the dependent claims.

The method of manufacturing the ceramic light transmitting barrier cell in accordance an aspect of the invention is for manufacturing a ceramic light transmitting barrier cell which encloses a luminescent material in a cavity of the ceramic light transmitting barrier cell. The luminescent material is configured to absorb a portion of light impinging on the luminescent material according to an absorption color distribution and to convert a part of the absorbed light into light having an emission color distribution. The method comprises the stages of: i) forming a part of a pre-formed barrier cell by providing a material mix into a first mold, the material mix comprises a binder and inorganic particles for forming a light transmitting ceramic material; ii) providing a sacrificial layer on the part for defining a cavity of the pre-formed barrier cell, the sacrificial layer comprises a sacrificial material for being sacrificed in the method of manufacturing the ceramic light transmitting barrier cell; iii) forming a remainder part of the pre-formed barrier cell by providing the material mix into a second mold, the second mold comprises the part with the sacrificial layer; iv) at least partially removing the sacrificial layer from the pre-formed barrier cell thereby obtaining the cavity of the pre-formed barrier cell.

The method of manufacturing the light transmitting barrier cell is an efficient method to manufacture such a light transmitting barrier cell because the final product is manufactured in one series of steps and does not require the manufacturing of semi-finished products which must be assembled/fastened/glued later in time. In particular this applies to the remainder part of the pre-formed barrier cell. The remainder part is formed in the second mold which already comprises the part with sacrificial layer. This allows the remainder part to directly attach to the first part with sacrificial layer. Thereby, in one step, the remainder part is manufactured and assembled to the part.

The method of manufacturing allows a full integration of the manufacturing stages in one manufacturing apparatus or a few apparatuses which cooperate and are directly coupled to each other with, for example, a conveyer or a robot arm. Additionally, it has been noticed that using a sacrificial layer is a relative efficient way of accurately manufacturing a cavity in the pre-formed barrier cell, and, thus, in the light transmitting barrier cell.

In summary, the method of manufacturing the ceramic light transmitting barrier cell uses in an advantageous way the sacrificial layer to obtain a cavity in a the ceramic light transmitting barrier cell and uses the step of forming the remainder part as an efficient step to manufacture this remainder part and to assemble this remainder part directly to the first part. More in particular, the fact that the sacrificial layer is present on the first part, when the remainder part is formed in the second mold, allows the integrated forming of the remainder part with the assembling to the first part. If the sacrificial layer would not be there, no cavity could be manufactured and the first part and the remainder part had to be manufactured separately.

Optionally, the method further comprises the stage of applying heat to the barrier cell for at least partially removing the binder and for transforming the pre-formed barrier cell into the ceramic light transmitting barrier cell. The pre-formed barrier cell is not yet completely finished because the binder is still in the pre-formed barrier cell and the inorganic particles present in the material mix are not yet sintered to form the final ceramic shape. Heating is a very efficient procedure to allow the binder to evaporate, to (thermally) decompose into volatile components or reacts with gas (e.g. air) into volatile components (e.g. gasses) and heating is also a very efficient step to create the final ceramic material. It is to be noted that in the heating stage the object may shrink, and, thus, the ceramic light transmitting barrier cell may be smaller than the pre-formed barrier cell. It is to be noted that the pre-formed barrier-cell may not yet be light transmitting because the binder may be of an opaque material. At least after heating (for example, when the ceramic is formed), the manufactured ceramic barrier cell is light transmitting.

Light transmitting means that when light impinges on one surface of the barrier cell, at least some light is transmitted through the barrier cell. This transmission is not by definition in a straight line, because the walls of the barrier cell may be translucent and, thus, (slightly) scatter the light. In an example, when we assume that the barrier cell does not comprise the luminescent material, at least 60% of visible light which impinges on the barrier cell is transmitted through the barrier cell. Visible light is light that is visible to the human naked eye.

Optionally, the stage of forming a part and of forming the remainder part is at least performed by one of: injection molding, slip casting, pressure casting or low pressure injection molding. Slip casting and pressure casting are technologies from the field of manufacturing ceramic objects. In those techniques the binder of the material mix is often a liquid, like, for example, water. Injection molding and low pressure injection molding are often used to manufacture plastic objects. When injection molding and/or low pressure molding are used the binder is, for example, a binder resin which may be a synthetic binder resin or a natural binder (e.g. wax). An advantage of injection molding over slip casting, pressure casting and low pressure injection molding is that it is better suitable for mass production at relatively low costs and may result in more accuracy. Furthermore, injection molding techniques are very flexible with respect to the final shape that is being manufactured (by using different molds). Additional advantages are that by using two injection molding stages, wherein, in the second injection molding stage, the part is present in the second mold and the same material is injected as in the first stage, a substantially monolithic light transmitting barrier cell may be manufactured. Such a monolithic light transmitting barrier cell is mechanically stronger and is a better barrier for liquids and gasses.

In an embodiment, the stage of heating the pre-formed barrier cell may comprises a first heating stage in which the pre-formed barrier cell is brought to a temperature which allows the at least partially removing of the binder and comprises a second heating stage in which the pre-formed barrier cell is sintered towards the final product, the ceramic light transmitting barrier cell.

Optionally, the stage of at least partially removing the sacrificial layer is combined with the stage of applying heat to the barrier cell. In this optional embodiment stages are combined resulting in an efficient manufacturing process.

Optionally, the method of manufacturing the ceramic light transmitting barrier cell further comprises the stage of at least partially removing the binder from the pre-formed barrier cell by providing a dissolving liquid to the pre-formed barrier cell which at least partially removes the binder from the pre-formed barrier cell. The stage of at least partially removing the binder is performed after forming the stage of forming the remainder part of the pre-formed barrier cell. Dissolving a part of the binder with a liquid is a relatively cheap and efficient step to remove the binder from the pre-formed barrier cell. It may be advantageous to do this, as discussed in one of the above optional embodiment, before the pre-formed barrier cell is heated because partially dissolving the binder creates a porous pre-formed barrier cell through which gasses may escape. During heating the pre-formed barrier cell gasses may be generated within the barrier cell (because, for example, a portion of the sacrificial layer thermally decomposes into gasses or reacts with oxygen and becomes a mixture of volatile components (e.g. gasses) or because, for example, some binder that is still in the pre-formed barrier cell reacts with oxygen) and the porous structure allows these gasses to escape and prevent that cracks arise in the barrier cell or that the whole barrier cell explodes. For the same reason and a further reason it may be advantageous to at least partially dissolve the binder in a dissolving liquid before the sacrificial layer is at least partially removed because during removing the sacrificial material, gasses may be generated. The further reason may be that the sacrificial material may also be dissolved in the same or another dissolving liquid and then the porous structure provides access to the sacrificial material.

Optionally, the stage of at least partially removing the sacrificial layer is combined with the stage of at least partially removing the binder. It might be that the binder and the sacrificial material both dissolve in the same dissolving liquid which creates an opportunity to combine both stages in one efficient and effective stage.

Optionally, the sacrificial material is at least one of: a first organic material which is soluble in the or another dissolving liquid, a second organic material which decomposes into volatile components (e.g. gasses) when it is heated to a thermal decomposition temperature of the second organic material, a material which depolymerizes under the influence of heat and/or a catalyst (e.g. poly-oxymethylene or poly-α-oxymethylstyrene), a material which becomes soluble in a specific dissolving liquid as a result of a photochemical reaction (e.g. novolac (phenol-formaldehyde) resins, poly methylmethacrylate or polysulfone), a material which becomes liquid when it is heated above its melting temperature, a material (a metal, for example, a foil of copper or molybdenum) which may be etched away by an etching liquid which does not react with the inorganic particles. These types of materials are effective materials for manufacturing a cavity in the ceramic light transmitting cell because the can be efficiently removed from the pre-formed barrier cell. Note that the specific dissolving liquid may be equal to the dissolving liquid or the another dissolving liquid. It is to be noted that when the second organic material decomposes into volatile components (e.g. gasses), it does not burn, because burning is a reaction in which an exothermic chemical reaction during which, for example, flames are formed and such exothermic reactions may damage the barrier cell. However, when the second organic material decomposes into volatile components, the volatile components may react with other gasses in the direct vicinity of the pre-formed barrier cell, however, the processes should be controlled to prevent the generation of flames or causing explosions. Further, if the material which becomes liquid when it is heated above its melting temperature is used, the melting temperature should have such a value that it is above a temperature at which the remainder part of the preformed barrier cell is manufactured such that the sacrificial layer remains solid in that stage of the method of manufacturing.

Optionally, the stage of at least partially removing the sacrificial layer comprises at least one of the stages: i) if the sacrificial material is the first organic material which is soluble in the or another dissolving liquid, providing the or another dissolving liquid to the pre-formed barrier cell in which the sacrificial material at least partially dissolves, ii) if the sacrificial material is the second organic material which decomposes into volatile components (e.g. gasses) when it is heated to the thermal decomposition temperature, heating the pre-formed barrier cell to a temperature above the thermal decomposition temperature, iii) if the sacrificial material is the material which depolymerizes under the influence of heat and/or the catalyst, providing the catalyst to the pre-formed barrier cell and heating the pre-formed barrier cell to a specific temperature that is high enough to obtain the depolymerization, iv) if the sacrificial material is the material which becomes soluble in the specific dissolving liquid as the results of the photochemical reaction, provide light to the pre-formed barrier cell and after which the specific dissolving liquid is provided to the barrier cell, v) if the sacrificial material is the material which becomes liquid when it is heated above its melting temperature, heating the pre-formed barrier cell to a temperature above the melting temperature and removing the liquid by means of wicking, and vi) if the sacrificial material is the material which may be etched away by the etching liquid, providing an etching liquid to the pre-formed barrier cell. These stages are, for the particular sacrificial materials, effective and efficient ways of removing the sacrificial layer such that the cavity is created in the barrier cell. With respect to iii) above, the catalyst may be in a gas phase such that it can be brought in contact with the sacrificial material. With respect to v) above, wicking is absorption of a liquid by a material by means of a capillary action, such as with a candle wick.

Optionally, in the stage of forming the remainder part of the pre-formed barrier cell, a channel is left open between the cavity and the outside of the pre-formed and the method further comprises the stages of, after the stage of heating the pre-formed barrier cell to obtain the ceramic light transmitting barrier cell, providing the luminescent material into the cavity via the channel and sealing the channel with an air-tight and liquid-tight seal. The luminescent material may be provided in a liquid and the liquid may be brought into the cavity via the channel. Manufacturing such a channel does not significantly increase costs because only the second mold needs to have a protrusion which defines the location of the channel. The seal that is provided to the channel may be a ceramic seal, but the channel may also be sealed by frit glass, a metal, an alloy (e.g. solder), and even a synthetic glue. A synthetic glue is not always 100% gas tight, however, because of a relatively small diameter of the channel, the amount of gas that may pass the seal is very low.

Optionally, the stage of providing a sacrificial layer comprises at least one of: i) manufacturing the sacrificial layer by means of injection molding, ii) providing a sheet of the sacrificial material on the part, iii) printing a layer of the sacrificial material on the part, iv) dispensing a layer of sacrificial material on the part, v) laminating the part. These ways of providing or creating the sacrificial layer on the part are efficient and effective ways of providing or creating such a layer.

Optionally, the inorganic particles comprise at least one of the materials: polycrystalline aluminum oxide ($Al_2O_3$), Yttrium aluminum garnet ($Y_3Al_5O_{12}$), spinel ($MgAl_2O_4$), Yttrium oxide ($Y_2O_3$), aluminum oxynitride (AlON), cubic Zirconium dioxide ($ZrO_2$). There materials are suitable for manufacturing a ceramic structure which is light transmitting. Furthermore, many ceramics, such as a ceramic made of polycrystalline aluminum oxide, has a high thermal conductivity which is advantageous in the context of transmitting heat away from luminescent material in the cavity.

Optionally, the binder comprises at least one of the materials: polyethylene, polypropylene, polyethylene oxide, polystyrene, polyamide (Nylon).

According to a second aspect of the invention, a barrier cell is provided. The barrier cell is made of a light transmitting ceramic material. The barrier cell has a monolithic structure and comprises a cavity for luminescent material. An outer layer of the barrier cell is impermeable for gasses and liquids. Ceramics are strong and robust materials and several ceramic materials provide excellent barriers for liquids and gasses and are also materials with a high thermal conductivity which is advantageous when heat needs to be conducted away from the luminescent material. The fact that the structure of the barrier cell is a monolithic structure results in a good impermeability properties with respect to gasses and liquids. It is to be noted that the term "monolithic structure" does not exclude that a channel or hole is present which provides access to the cavity. Furthermore, the term "monolithic structure" does not exclude embodiments of barrier cells in which such a channel or such a hole is lateron sealed with a specific material. The term monolithic structure at least means that the barrier cell consists for the largest part of one monolithic ceramic structure and does not comprise several ceramic elements that are, for example, glued to each other.

The barrier cell according to the second aspect of the invention provides the similar benefits as the method according to the first aspect of the invention and has similar embodiments with similar effects as the corresponding embodiments of the method.

Optionally, the barrier cell further comprises the luminescent material in the cavity, the luminescent material being configured to absorb a first portion of light impinging on the luminescent material according to an absorption color distribution and to convert a portion of the absorbed light into light according to an emission color distribution.

Optionally, the luminescent material comprises particles showing quantum confinement and having at least in one dimension a size in the nanometer range.

Optionally, the luminescent material comprises one of: quantum dots, quantum rods and quantum tetrapods.

Optionally, the luminescent material comprises organic luminescent materials.

Optionally, the barrier cell comprises at least one channel through the outer layer for providing access to the cavity.

Optionally, if the cavity comprises the luminescent material, the channel is closed by an air-tight and liquid-tight seal.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the device and/or the method, which correspond to the described modifications and variations of the method and/or the device, respectively, can be carried out by a person skilled in the art on the basis of the present description.

Figure 1:
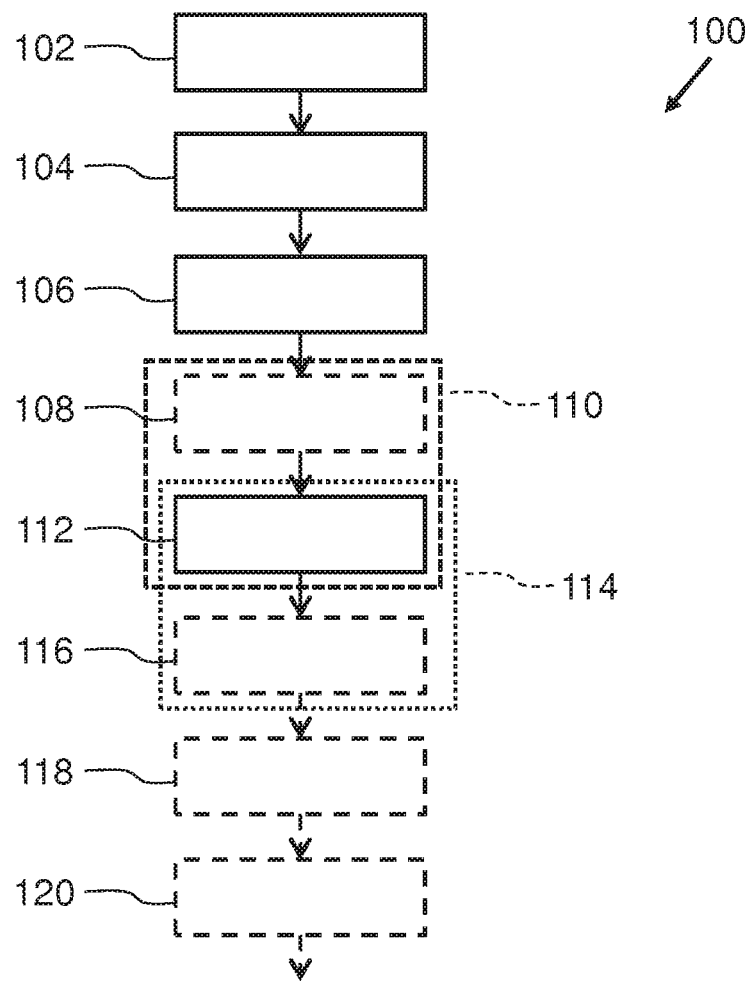
FIG. 1 schematically shows a flowchart of a method of manufacturing a ceramic light transmitting barrier cell, FIGS. 2a to 2c schematically illustrate some of the steps of the method of manufacturing the ceramic light transmitting barrier cell, FIG. 2d schematically shows the pre-formed barrier cell, FIGS. 3a and 3b schematically illustrate optional steps of the method of manufacturing the ceramic light transmitting barrier cell, FIGS. 4a to 4c schematically illustrate some optional steps of the method of manufacturing the ceramic light transmitting barrier cell, FIGS. 4d and 4e schematically present embodiments of the ceramic light transmitting barrier cell, FIG. 5a schematically presents an embodiment of a light source, FIG. 5b schematically presents an embodiment of a luminaire.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

FIG. 1 schematically shows an embodiment of a method 100 of manufacturing a ceramic light transmitting barrier cell. The manufactured light transmitting cell is for enclosing a luminescent material in a cavity of the ceramic light transmitting barrier cell. The luminescent material is configured to absorb a first portion of light impinging on the luminescent material according to an absorption color distribution and to convert a part of the absorbed light into light having an emission color distribution. The method 100 comprises the stages of: i) forming 102 a part of a pre-formed barrier cell of a material mix in a first mold, the material mix comprises a binder and inorganic particles for forming a light transmitting ceramic material, ii) providing 104 a sacrificial layer on the part for defining a cavity of the pre-formed barrier cell, the sacrificial layer comprises a sacrificial material for being sacrificed in the method of manufacturing the ceramic light transmitting barrier cell, iii) forming 106 a remainder part of the pre-formed barrier cell by providing the material mix in a second mold, the second mold comprises the part with the sacrificial layer, iv) at least partially removing 112 the sacrificial layer from the pre-formed barrier cell thereby obtaining a cavity in the pre-formed barrier cell.

The forming of the first part and/or the forming of the another part may be performed by means of slip casting, pressure casting, low pressure injection molding or injection molding technologies. In general, injection molding with a certain pressure is preferred because it allows relatively cheap mass production and results in general in relatively accurately formed pre-formed barrier cells.

The material mix comprises inorganic particles, for example, particles of polycrystalline aluminum oxide, or ($Al_2O_3$), Yttrium aluminum garnet ($Y_3Al_5O_{12}$), spinel ($MgAl_2O_4$), Yttrium oxide ($Y_2O_3$), aluminum oxynitride (AlON), cubic Zirconium dioxide ($ZrO_2$). The inorganic particles are suitable for forming a light transmitting ceramic material of them, for example, by sintering them. The light transmitting ceramic material is, in an embodiment, a polycrystalline ceramic material. The particles of the inorganic material for forming the light transmitting ceramic material have, for example, an average grain size in the range from 0.3 to 150 µm, or, for example, 10 to 60 µm, or 15 to 30 µm. The binder is, for example, polyethylene, polypropylene, polyethylene oxide, polystyrene, polyamide (Nylon). The sacrificial material may be one of the materials: a) a first organic material which is soluble in a dissolving liquid, for example, polyethylene glycol or polyethylene oxide b) a second organic material which decomposes into volatile components (e.g. gasses) when it is heated to a thermal decomposition temperature, for example, carbon (e.g. a carbon foil), c) a material which depolymerizes under the influence of heat and/or a catalyst, for example, the material which his named Catamold and which is a product of BASF, poly-oxymethylene, or poly-α-oxymethylstyrene) a material which becomes soluble in a specific dissolving liquid as a result of a photochemical reaction, for example, novolac (phenol-formaldehyde) resins, poly methylmethacrylate, polysulfone, or any other material which is also often used as a photoresist material. As will be discussed lateron, the material mix may also comprise inorganic phosphor particles. Also other materials may be provided to the material mix to increase the light transmission through the material. For example, when polycrystalline aluminum oxide is used for manufacturing the light transmitting ceramic barrier cell, the material mix may also comprises particles of Zirconium dioxide ($ZrO_2$) or Magnesium oxide (MgO).

Providing 104 the sacrificial layer to the part of the pre-formed barrier cell may be done with one of the subsequent techniques: k) manufacturing the sacrificial layer by means of injection molding, l) providing a sheet of the sacrificial material on the part, m) printing a layer of the sacrificial material on the part, n) dispensing a layer of sacrificial material on the part, o) (partially) laminating the part with a layer of the sacrificial material. When the sacrificial layer is manufactured by means of injection molding, the part is provided in a third mold and a space in between the part and the walls of third mold is filled with the sacrificial material.

If the sacrificial material is the first organic material which is soluble in the or another dissolving liquid, the stage of at least partially removing 112 the sacrificial layer comprises providing the dissolving liquid to the pre-formed barrier cell in which the sacrificial material at least partially dissolves. If the sacrificial material is the second organic material which decomposes into volatile components (e.g. gasses) when it is heated to the thermal decomposition temperature, the stage of at least partially removing 112 the sacrificial layer comprises heating the pre-formed barrier cell to a temperature above the thermal decomposition temperature. It may be that the sacrificial material also reacts with the gasses present in its direct environment and that volatile components are the products of the reaction, however, it should be prevented that the sacrificial material starts to burn (in the meaning of: an exothermic reaction with flames, etc.). If the sacrificial material is the material which depolymerizes under the influence of heat and/or the catalyst, the stage of at least partially removing 112 the sacrificial layer comprises providing the catalyst to the pre-formed barrier cell and heating the pre-formed barrier cell to a specific temperature that is high enough to obtain the depolymerization. The catalyst may, for example, be provided in the gas phase to the pre-formed barrier cells such that the gas phase catalyst may come in contact with the sacrificial material. If the sacrificial material is the material which becomes soluble in the specific dissolving liquid as the results of the photochemical reaction, the stage of at least partially removing 112 the sacrificial layer comprises providing light to the pre-formed barrier cell after which the specific dissolving liquid is provided to the barrier cell.

The method comprises the optional stage of applying 116 heat to the barrier cell for at least partially removing the binder and for transforming the pre-formed barrier cell into the ceramic light transmitting barrier cell. The optional stage of applying 116 heat may be combined with the stage of at least partially removing 112 the sacrificial layer thereby creating the combined stage 114. Under the influence of heat the material of the sacrificial layer may evaporate, thermally decompose into volatile components or react with air thereby creating gasses (actually, which is more or less equal to "burning" away at least partially removing 112 the sacrificial layer).

The stage of applying 116 heat may be subdivided in sub-heating stages at different temperatures. For example, in a first sub-heating stage the (remaining) binder and remaining sacrificial material is burnt away and in a subsequent second sub-heating stage the pre-formed barrier cell is sintered to obtain the final ceramic light transmitting barrier cell. Exemplary heating temperatures for these sub-heating stages are: 600 degrees Celsius for allowing the binder and the sacrificial material to thermally decompose into gasses or react with a gas or with gasses and 1900 degrees Celsius for sintering the pre-formed barrier cell. While sintering the pre-formed barrier cell, the inorganic particles merge together to form a monolithic ceramic material. At least after sintering the formed ceramic barrier-cell has its final shape (which is in general about 25 percent smaller in size than the pre-formed barrier cell) and at least after sintering the ceramic material is light transmitting and gas tight. In the stage of sintering remainders of the binder and the sacrificial material are burnt away. However, as will be discussed hereinbefore and hereinafter, the binder and/or the sacrificial material may already be (partially) removed before a sintering stage is performed.

At least after the stage of forming 106 the remainder part of the pre-formed barrier cell, the method comprises the stage of at least partially removing 108 the binder from the pre-formed barrier cell by providing a dissolving liquid to the pre-formed barrier cell which at least partially removes the binder from the pre-formed barrier cell. When at least a part of the binder is removed from the pre-formed barrier cell by a dissolving stage, a porous structure of inorganic particles is created. In optional subsequent heating stages gasses may be formed in the pre-formed barrier cell and these gasses may leave the pre-formed barrier cell via the porous structure. The optional stage of at least partially removing 108 the binder may be combined with the stage of at least partially removing 112 the sacrificial layer thereby creating the combined stage 110. It might be that the dissolving liquid is also suitable for dissolving the sacrificial layer and in that case, when the pre-formed barrier cell is kept for some longer period of time in the dissolving liquid, the sacrificial layer may also be (at least partially) removed. When the dissolving liquid removes a relatively large amount of the binder, the dissolving liquid may arrive via the porous structure at the sacrificial layer and may thereby also dissolve at least a portion of the sacrificial material.

Subsequent optional stages are, when the ceramic light transmitting barrier cell comprises a channel which provides access to the cavity of the ceramic light transmitting barrier cell: providing 118 the luminescent material into the cavity via the channel and/or sealing 120 the channel with an air-tight and liquid-tight ceramic seal. In the stage of sealing 120 the channel with an air-tight and liquid-tight ceramic seal, the material mix or another material mix with inorganic particles may be provided in the channel and by means of a local heating technology the material in the channel is transformed into an air and liquid-tight ceramic material. Locally heating the material mix in the channel may be performed by providing energy in the form of laser light.

Unless otherwise provided, in the subsequent Figures cross-sectional views of pre-formed barrier cells and ceramic light transmitting barrier cells are provided. Examples of the 3 dimensional shape of such cells are: disk shaped cells, (flat-)box shaped cells, elliptical shaped cells, dome shaped cells, etc. In the subsequent Figures the method of manufacturing the light transmitting barrier cell is illustrated by using an injection molding technique. Note that the injection molding technique may be replaced by other techniques to manufacture objects of the material mix of a binder and inorganic particles such that these objects may be sintered later for obtaining a ceramic object. Alternative techniques are slip casting, pressure casting and low pressure injection molding. A person skilled in the field of manufacturing ceramic objects is capable of replacing the subsequently presented injection molding by these techniques.

Figure 2A:
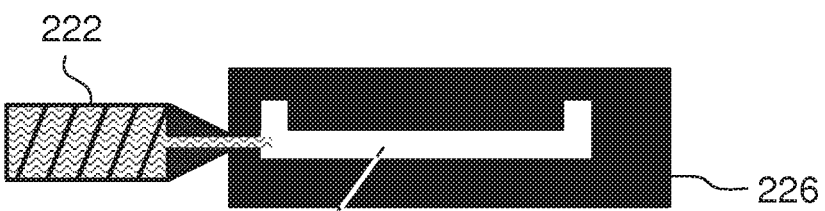
Figure 2B:
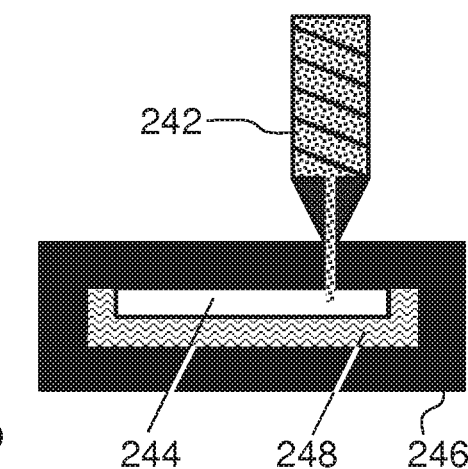
Figure 2C:
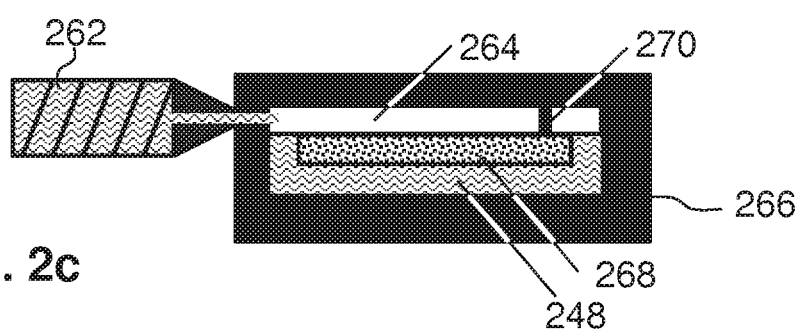

FIGS. 2a to 2c schematically illustrate some of the steps of the method of manufacturing the ceramic light transmitting barrier cell. FIG. 2a presents a first mold 226 which comprises a cavity 224 that has a shape of the part of the pre-formed barrier-cell and FIG. 2a presents an apparatus 222 for injecting a material mix into the first mold 226. The apparatus 222 comprises, for example, a helix shaped screw which is used to inject the first material into the first mold 226. It is to be noted that the first mold 226 and the second mold 266 are both adapted to manufacture the specific shape of a barrier cell, which means that the combination of the structures that are manufactured form the barrier cell. Thus, the first mold 226 defines a portion of the outer and inner surface of the barrier cell and the second mold (assuming that the sacrificial layer is provided) defines another portion of the outer surface of the barrier cell. Thus, the molds 226, 266 also have such a shape that the remainder part (which is formed like is schematically shown in FIG. 2c) seamlessly connects/abuts to the part (with sacrificial layer). The sacrificial layer is used to define a cavity space inside the barrier cell. When the sacrificial layer is removed from the pre-formed barrier cell, a cavity is left in which, in later stages, the luminescent material may be provided.

FIG. 2c presents a second mold 266 in which the part 248 with the sacrificial layer 268 is provided. Inside is the second mold 266, above the part 248 with the sacrificial layer 268, is an open space 264 which has a shape of a remainder part of the pre-formed barrier cell. In the example of FIG. 2c, the second mold 260 comprises a protrusion 270 which extends into the open space 264 such that a channel is formed in the pre-formed barrier cell. At the left end of FIG. 2c is also presented an apparatus 262 which is used to inject the material mix into the open space 264 of the second mold 266.

More details about the context of FIGS. 2a and 2c discussed manufacturing steps can, for example, be found in "Ceramic Injection Molding", MUTSUDDY, B. and FORD, G., publisher: Chapman & Hall, 1995.

FIG. 2b presents an embodiment of the step of providing the sacrificial layer on the part 248 of the pre-formed barrier cell. In FIG. 2b a third mold 246 is drawn in which the part 248 is provided. In between the part 248 and the third mold 246 is an open space which defines the shape of the sacrificial layer. At the top of FIG. 2b is presented an apparatus 242 which is used to inject the sacrificial material into the open space 244 to form the sacrificial layer on the part 248. It is to be noted that the sacrificial may also be provided in different ways on the part 248. For example, sheets of sacrificial material may be cut into pieces and provided on the part 248. Or, in another example, the sacrificial layer may be printed with a printer which operates in a similar way as inkjet printers, or the sacrificial material is dispensed on the part, or the part is locally laminated with a layer of the sacrificial material. The step of providing a sacrificial layer is not restricted to the above examples only.

Figure 2D:
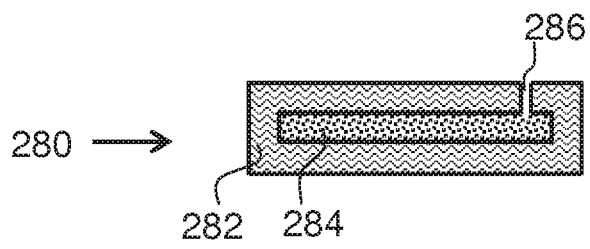

FIG. 2d schematically shows the pre-formed barrier cell 280. The pre-formed barrier cell 280 as presented in FIG. 2d may be the result of the manufacturing stages of FIGS. 2a to 2c. This pre-formed barrier cell 280 comprises an inner space which is filled with the sacrificial material 284 and comprises an outer wall 282 which is made of the binder mixed with the inorganic particles. Optionally, the outer wall 282 comprises a channel 286 which provides access to the space filled with the sacrificial material 284.

Figure 3A:
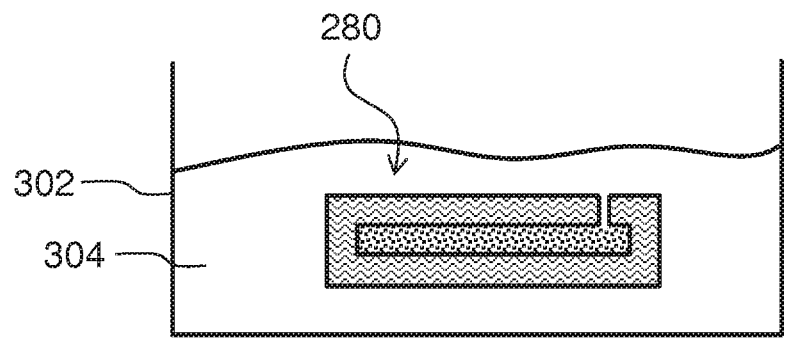
Figure 3B:
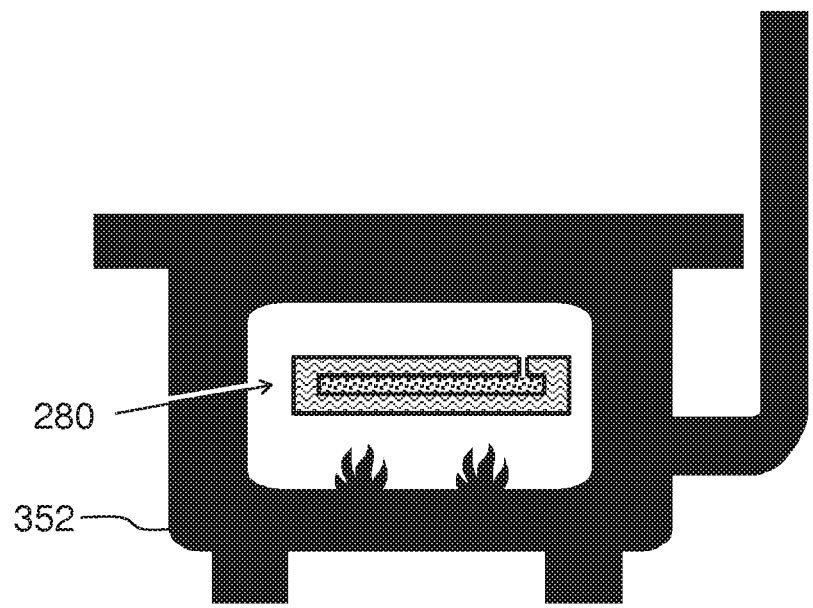

FIGS. 3a and 3b schematically illustrate optional steps of the method of manufacturing the ceramic light transmitting barrier cell. In FIG. 3a schematically shows that the pre-formed barrier cell 280 may be placed in a bath 320 with a dissolving liquid 304. The dissolving liquid 304 may be suitable to dissolving at least a portion of the binder that is present in the walls of the pre-formed barrier cell 280. In another embodiment, the dissolving liquid may also dissolve a portion of the sacrificial layer. It is to be noted that it is not necessary to place the pre-formed barrier cell 280 in a bath 302 with a dissolving liquid 304. In other embodiments, the dissolving liquid is sprayed over the pre-formed barrier cell 280 or the pre-formed barrier cell 280 is provided in a stream of dissolving liquid 304. Note that further stages of providing another dissolving liquid may be provided for, for example, dissolving the sacrificial material when the sacrificial material dissolving not in the dissolving liquid 304, but in another dissolving liquid.

FIG. 3b schematically shows that the pre-formed barrier cell 280 may be provided in an oven 352 for heating the pre-formed barrier cell 280. During the heating the binder may be (at least partially) removed, the sacrificial layer may be (at least partially) removed, and/or the pre-formed barrier cell 280 may be sintered to form the final ceramic material and shape of the ceramic light transmitting barrier cell.

Figure 4A:
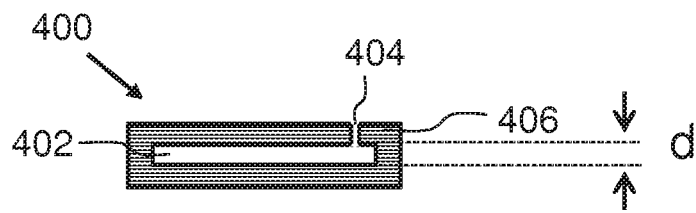

FIG. 4a schematically presents the ceramic light transmitting cell 400. The ceramic light transmitting barrier cell 400 comprises outer walls 406 of a light transmitting ceramic material which is a barrier for gasses and liquid. The outer walls 406 form together a monolithic structure. The outer walls 406 enclose a cavity 402 and optionally a channel 404 may be provided in between the cavity 402 and the ambient of the ceramic light transmitting barrier cell 400. When ignoring the channel 404, the cavity is protected against liquids and gasses because the outer walls 406 are not permeable for gasses and liquids. In an embodiment, the outer walls 406 are made of such a ceramic material that the outer walls 406 are also a good thermal conductor which is advantageous when heat generated in the cavity 402 must be conducted away towards the ambient of the ceramic light transmitting barrier cell 400. The ceramic material of the outer walls may be based on aluminum oxide. It is to be noted that, often, the ceramic light transmitting barrier cell 400 has a smaller shape than the pre-formed barrier cell 280 of FIGS. 2e, 3a and 3b. For example, during a sintering step the pre-formed barrier cell 280 shrinks towards the final required size of the ceramic light transmitting barrier cell 400. In FIG. 4a the depth of the cavity is indicted with d. The depth d is typically in a range from 0.05 mm to 1 cm, or, an in another example, from 0.1 to 0.5 mm.

Figure 4B:
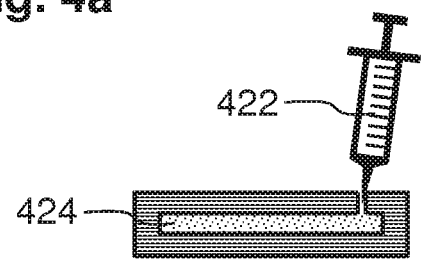
Figure 4C:
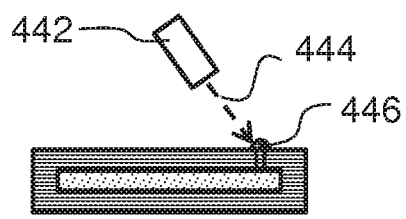

FIGS. 4b to 4c schematically illustrate some optional steps of the method of manufacturing the ceramic light transmitting barrier cell 400. In FIG. 4b it has been schematically shown that luminescent material 424 is provided into the cavity 402 of the ceramic light transmitting barrier cell. By way of example this may be done by using injection means 422 to inject a liquid with luminescent material into the cavity 402. In FIG. 4c it has been shown that the channel 404 is closed with a liquid and gas tight seal 446. This may be done by providing inorganic particles in and on the channel and by locally heating the environment of the channel such that the provided material mix becomes a ceramic material or, for example, glass and tightens to the ceramic material of the outer walls 406 of the ceramic light transmitting barrier cell. Laser light, generated by a laser 442, may be used to locally heat the channel and the direct environment of the channel. It is not necessary to use the material mix to seal the channel. Other material mixes which comprise ingredients for manufacturing an air and gas tight seal may be used as well. More information about closing such a channel can be found in, for example, WO2008078228A1.

Figure 4D:
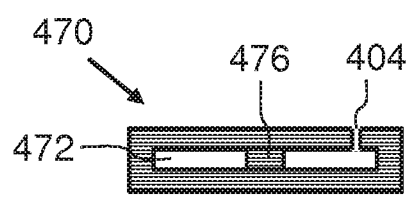
Figure 4E:
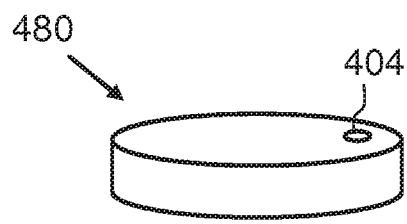

FIGS. 4d and 4e schematically present embodiments of ceramic light transmitting barrier cells 470, 480. In FIG. 4d a cross-sectional view of another embodiment of a ceramic light transmitting barrier cell 470 is provided. Within a cavity 472 of the ceramic light transmitting barrier cell 470 is provided a support 476 in between a front wall and a rear wall of the ceramic light transmitting barrier cell 470. Such a support 476 may be provided to prevent that, for example, during a sintering stage, the cavity collapses. More than one support 476 may also be provided. Such a support may be manufactured in the stage of forming the part of the pre-formed barrier cell by using a first mold which comprises a recess that defines the shape of the support 476. In another embodiment, when the sacrificial layer is provided on the part, a hole may be present, or may be created, in the sacrificial layer which defines a space in which, during the stage of forming a remainder part of the pre-formed barrier cell, the material mix is injected. In FIG. 4e a three dimensional view of a disk shaped ceramic light transmitting barrier cell 480 is presented. It is to be noted that possible shapes of the ceramic light transmitting barrier cell are not limited to disk shaped ceramic light transmitting barrier cell 480. Other possible shapes are: a shape of a (rectangular) flat box, a dome shape, a shape of a lens, a droplet shape, etc. It is further to be noted that in all examples the cavity (for the luminescent material) has a homogeneous depth along the barrier cell, however, embodiments of ceramic light transmitting barrier cells are not limited to ceramic light transmitting barrier cells with cavities of a single depth. In specific applications it might be necessary to vary the depth of the cavity such that a varying amount of luminescent material is present a various locations, for example, when color differences must be created along the barrier cell or when the received light does not have an homogeneous light distribution along the whole barrier cell.

The luminescent material 424 that is provided in the cavity 402 of the ceramic light transmitting barrier cell 400 may be one of: an organic luminescent material (which is, for example based on perylene derivative), an inorganic luminescent material, a material which shows quantum confinement and having at least in one dimension a size in the nanometer range (for example, quantum dots, quantum rods and quantum tetrapods).

In an embodiment, the material mix also comprises an inorganic luminescent phosphor (for example, the material mix comprises particles of alumina and 1% particles of Ce:YAG). Then, the barrier cell converts at least some of the received light towards yellow light and the luminescent material in the cavity may be used to convert some of the light towards light of another color (for example, red) such that the combination of emitted/transmitted light comprises a portion of the light that was received from a light emitter (for example, blue light), yellow light generated by the inorganic phosphor, and red light generated by the luminescent material in the cavity.

Organic phosphors have a high quantum efficiency and are often transparent, which prevents undesired scattering and increases efficiency. Organic luminescent materials have more advantages. The position and the bandwidth of the luminescence spectrum can be designed with ease to be anywhere in the visible range. As such it is relatively easy to manufacture a light source which emits white light with high efficacy. The white light may be a combination of at least two colors of light, and thus the light source may comprise a single light emitter that emits light of a first color and comprise at least one organic luminescent material that converts a part of the light of the first color into a light of a second color.

The organic phosphor may be a material which comprises a perylene derivative, such as a yellow emitting perylene derivative, or a red/orange emitting perylene derivate. Such perylene derivatives are commercially available under the name Lumogen Yellow F083 or F170, Lumogen Red F305 and Lumogen Orange F240.

There is a nearly unlimited assortment of such organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Hence, one or more of the luminescent moieties may comprise perylene groups. Especially, one or more luminescent moieties are configured to generate red luminescence upon excitation by blue and/or UV light.

The inorganic luminescent material may comprises a yellow or yellow/green emitting inorganic phosphor, such as YAG and/or LuAG, or a red inorganic phosphor such as ECAS and/or BSSN.

Examples of inorganic phosphors suitable as luminescent materials include, but are not limited to, cerium doped yttrium aluminum garnet $(Y_3Al_5O_{12}:Ce^{3+}$, also referred to as YAG:Ce or Ce doped YAG) or lutetium aluminum garnet (LuAG, $Lu_3Al_5O_{12}$), α-SiAlON:$Eu^{2+}$ (yellow), and $M_2Si_5N_8:Eu^{2+}$ (red) wherein M is at least one element selected from calcium Ca, Sr and Ba. Furthermore, a part of the aluminum may be substituted with gadolinium (Gd) or gallium (Ga), wherein more Gd results in a red shift of the yellow emission. Other suitable materials may include $(Sr_{1-x-y}Ba_xCa_y)_{2-z}Si_{5-a}Al_aN_{8-a}O_a:Eu_z^{2+}$ wherein $0 \le a < 5$, $0 \le x \le 1$, $0 \le y \le 1$ and $0 < z \le 1$, and $(x+y) \le 1$, such as $Sr_2Si_5N_8:Eu^{2+}$ which emits light in the red range.

The luminescent material may comprises particles showing quantum confinement and have at least in one dimension a size in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 500 nanometer, and larger or equal to 0.5 nanometer. In an embodiment, the size in one dimension is smaller than 50 nanometer. In another embodiment the size in one dimension is in the range from 2 to 30 nanometer. Quantum confinement means that the particles have optical properties that depend on the size of the particles. Examples of such materials are quantum dots, quantum rods and quantum tetrapods.

In embodiments of the invention the luminescent materials may comprise quantum dots. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide (CuInS$_2$) and/or silver indium sulfide (AgInS$_2$) can also be used. Quantum dots show very narrow emission band and thus they show saturated colors. Furthermore, the emission color can easily be tuned by adapting the size of the quantum dots. Any type of quantum dot known in the art may be used in the present invention, provided that it has the appropriate wavelength conversion characteristics.

Figure 5A:
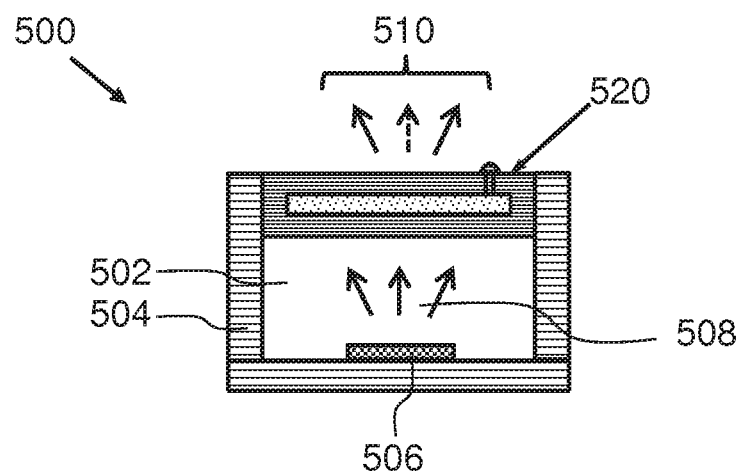

FIG. 5a schematically presents a cross-sectional view of an embodiment of a light source 500. The light source 500 comprises a housing 504 which might have, for example, a cylindrical shape, or a box shape. The housing 504 encloses a cavity 502 in which a light emitter 506 is provided. The light source 500 further comprises a ceramic light transmitting barrier cell 520 which comprises a luminescent material. The light emitter 506 emits light 508 which comprises at least light in an absorption color distribution and emits at least light 508 towards the ceramic light transmitting barrier cell 520. In an example, the light emitter 506 is a solid state light emitter, such as, for example, a Light Emitting Diode (LED). A portion of the light 508 is absorbed by the luminescent material in accordance with the absorption color distribution and converted towards light of another color in accordance with an emission color distribution. Light 510 that is emitted by the light source into the ambient may comprise light 508 which is emitted by the light emitter 506 and light that is emitted by the luminescent material of the ceramic light transmitting barrier cell 520. The ceramic light transmitting barrier cell 520 is well capable of conducting heat away from the luminescent material and provide the heat towards the housing 504 of the light source 500. FIG. 5a is just one example of the use of the ceramic light transmitting barrier cell 520 in the light source 500. Other constructions of the light source 500 are not excluded. In another embodiment, for example, the ceramic light transmitting barrier cell 520 is positioned directly on top of the light emitter 506.

Figure 5B:
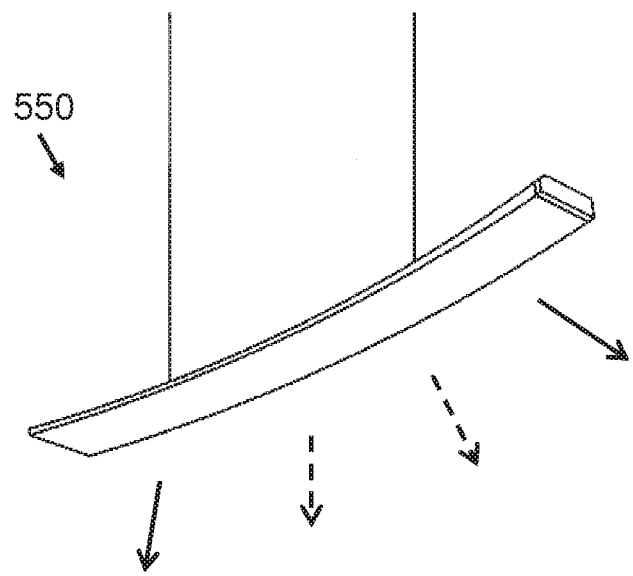

FIG. 5b schematically presents an embodiment of a luminaire 550. The luminaire 550 comprises a light source (not shown) according to the invention or comprises a ceramic light transmitting barrier cell (not shown) according to the invention.

In summary, a method of manufacturing a ceramic light transmitting barrier cell for enclosing a luminescent material and such a ceramic light transmitting barrier cell are provided. A part of a pre-formed barrier cell is formed by providing a material mix comprising a binder and inorganic particles in a first mold. On the part is provided 104 a sacrificial layer for defining a cavity. A remainder part of the pre-formed barrier cell is formed by providing the material mix in a second mold which already comprises the part with the sacrificial layer. The sacrificial layer is at least partially removed to obtain the cavity. Optionally, the pre-formed barrier cell is heated (and/or sintered) to obtain the ceramic light transmitting barrier cell. The method of manufacturing is suitable for producing at large scale relatively cheap and accurately formed ceramic light transmitting barrier cells.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or stages/steps other than those stated in a claim. The article "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of manufacturing a ceramic light transmitting barrier cell for enclosing a luminescent material in a cavity of the ceramic light transmitting barrier cell, the luminescent material being configured to absorb a portion of light impinging on the luminescent material according to an absorption color distribution and to convert a part of the absorbed light into light having an emission color distribution, the method comprises the stages of:
    forming a part of a pre-formed barrier cell by providing a material mix into a first mold, the material mix comprising a binder and inorganic particles for forming a light transmitting ceramic material,
    providing a sacrificial layer on the part for defining a cavity of the pre-formed barrier cell, the sacrificial layer comprising a sacrificial material for being sacrificed in the method of manufacturing the ceramic light transmitting barrier cell,
    forming a remainder part of the pre-formed barrier cell by providing the material mix into a second mold, the second mold comprising the part with the sacrificial layer,
    at least partially removing the sacrificial layer from the pre-formed barrier cell thereby obtaining the cavity of the pre-formed barrier cell.

2. A method according to claim 1, further comprising the stage of:
    applying heat to the pre-formed barrier cell for at least partially removing the binder and for transforming the pre-formed barrier cell into the ceramic light transmitting barrier cell.

3. A method according to claim 1, wherein the stage of forming a part and of forming the remainder part is at least performed by one of: injection molding, slip casting, pressure casting or low pressure injection molding.

4. A method according to claim 1, further comprising the stage of:
    after the stage of forming the remainder part, at least partially removing the binder from the pre-formed barrier cell by providing a dissolving liquid to the pre-formed barrier cell which at least partially removes the binder from the pre-formed barrier cell.

5. A method according to claim 1, wherein the sacrificial material is at least one of:
    a first organic material which is soluble in the dissolving liquid or in another dissolving liquid,
    a second organic material which decomposes into volatile components when it is heated to a thermal decomposition temperature at which a thermal decomposition of the second organic material starts,
    a material which depolymerizes under the influence of heat and/or a catalyst, a material which becomes soluble in a specific dissolving liquid as a result of a photochemical reaction,
    a material which becomes liquid when it is heated above its melting temperature,
    a material which may be etched away by an etching liquid which does not react with the inorganic particles.

6. A method according to claim 5, wherein the stage of at least partially removing the sacrificial layer comprises at least one of the stages:

if the sacrificial material is the first organic material which is soluble in the or the another dissolving liquid, providing the or the another dissolving liquid to the pre-formed barrier cell in which the sacrificial material at least partially dissolves, if the sacrificial material is the second organic material which decomposes into volatile components when it is heated to the decomposition temperature, heating the pre-formed barrier cell to a temperature above the thermal decomposition temperature and removing the decomposed sacrificial material, if the sacrificial material is the material which depolymerizes under the influence of heat and/or the catalyst, providing the catalyst to the pre-formed barrier cell and heating the pre-formed barrier cell to a specific temperature that is high enough to obtain the depolymerization, if the sacrificial material is the material which becomes soluble in the specific dissolving liquid as the results of the photochemical reaction, providing light to the pre-formed barrier cell after which the specific dissolving liquid is provided to the barrier cell, if the sacrificial material is the material which becomes liquid when it is heated above its melting temperature, heating the pre-formed barrier cell to a temperature above the melting temperature and removing the liquid by means of wicking, if the sacrificial material is the material which may be a material which may be etched away by the etching liquid, providing an etching liquid to the pre-formed barrier cell.

7. A method according to claim 2, wherein, in the stage of forming the remainder part, a channel is left open between the cavity and the outside of the pre-formed barrier cell,
and the method comprising also the stages of:
after the stage of heating to obtain the ceramic light transmitting barrier cell, providing the luminescent material into the cavity via the channel,
sealing the channel with an air-tight and liquid-tight seal.

8. A method according to claim 1, wherein the stage of providing a sacrificial layer comprises at least one of: i) manufacturing the sacrificial layer by means of injection molding, slip casting or pressure casting, ii) providing a sheet of the sacrificial material on the part, iii) printing a layer of the sacrificial material on the part, iv) dispensing a layer of sacrificial material on the part, v) laminating the part with a foil of the sacrificial layer.

9. A method according to claim 1, wherein the inorganic particles comprise at least one of the materials: polycrystalline aluminum oxide, yttrium aluminum garnet, spinel, yttrium oxide, aluminum oxynitride, cubic zirconium dioxide.

10. A method according to claim 3, wherein, if the part and the remainder part are formed by means of injection molding, the binder comprises at least one of the materials: polyethylene, polypropylene, polyethylene oxide, polystyrene, polyamide.

11. A light transmitting barrier cell for enclosing a luminescent material, the barrier cell comprising a monolithic ceramic structure that is devoid of any insert, the monolithic ceramic structure defining an enclosed cavity for the luminescent material and a channel in communication with the cavity, wherein an outer layer of the barrier cell is impermeable for gasses and liquids.

12. A light transmitting barrier cell, comprising:
a monolithic ceramic structure, the monolithic ceramic structure defining an enclosed cavity and a channel in communication with the cavity, and
a luminescent material in the cavity, the luminescent material being configured to absorb a portion of light impinging on the luminescent material according to an absorption color distribution and to convert a portion of the absorbed light into light according to an emission color distribution.

13. A barrier cell according to claim 12, wherein at least one of:
the luminescent material comprises particles showing quantum confinement and having at least in one dimension a size in the nanometer range, the particles being selected from the group consisting of quantum dots, quantum rods and quantum tetrapods,
the luminescent material comprises inorganic or organic luminescent material.

14. A barrier cell according to claim 12, further comprising an air-tight and liquid-tight seal to the channel.

15. A light source for emitting light, the light source comprises:
a light emitter for emitting light,
a barrier cell according to claim 12, wherein the barrier cell is arranged to receive at least a portion of the light emitted by the light emitter.

16. A barrier cell according to claim 11 further comprising a sacrificial material in the cavity.

17. A barrier cell according to claim 12, wherein the outer layer comprises a top wall, a bottom wall, and a sidewall between the top and the bottom walls, the channel being define in one of the top and the bottom walls.

18. A barrier cell according to claim 17, further comprising a support between the top and the bottom walls.

19. A barrier cell according to claim 17, wherein the barrier cell comprises a disk shape, a rectangular shape, a dome shape, a lens shape, or a droplet shape.

20. A method according to claim 2, wherein the stage of at least partially removing the sacrificial layer is combined with the stage of applying heat to the pre-formed barrier cell.

21. A method according to claim 4, wherein the stage of at least partially removing the sacrificial layer is combined with the stage of at least partially removing the binder.

* * * * *